United States Patent
Chen et al.

(10) Patent No.: US 6,989,559 B2
(45) Date of Patent: Jan. 24, 2006

(54) DISCRETE CIRCUIT COMPONENT HAVING FABRICATION STAGE CLOGGED THROUGH-HOLES AND PROCESS OF MAKING THE SAME

(75) Inventors: Wen-Long Chen, Taipei (TW); Cheng-Chieh Yang, Taipei (TW); Chih-Liang Hu, Taipei (TW)

(73) Assignee: Comchip Technology Co., Ltd., Taipei Hsien (TW)

( * ) Notice: Subject to any disclaimer, the term of this patent is extended or adjusted under 35 U.S.C. 154(b) by 57 days.

(21) Appl. No.: 10/249,788

(22) Filed: May 8, 2003

(65) Prior Publication Data

US 2004/0198043 A1 Oct. 7, 2004

(30) Foreign Application Priority Data

Apr. 2, 2003 (TW) .................................... 92107483 A

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ........................................ 257/288; 257/678
(58) Field of Classification Search ................ 257/288, 257/292, 678, 777, 778, 779, 780, 781, 782, 257/824, 924

See application file for complete search history.

(56) References Cited

U.S. PATENT DOCUMENTS

| 5,360,948 A | * | 11/1994 | Thornberg ................... 174/263 |
| 5,625,207 A | * | 4/1997 | Trolle et al. ................. 257/207 |
| 5,814,847 A | * | 9/1998 | Shihadeh et al. ........... 257/209 |

* cited by examiner

*Primary Examiner*—David Nhu
(74) *Attorney, Agent, or Firm*—Jiang Chyun IP Office

(57) ABSTRACT

A discrete circuit component is made from a substrate with the first and second surfaces thereof each having a corresponding matrix of electrically conductive segments. A plated through-hole connects each of the conductive segments of each the first and second conductive segments electrically. The through-hole is first clogged and then subsequently cleared of clogging in the fabrication stages.

11 Claims, 5 Drawing Sheets

DISCRETE CIRCUIT COMPONENT HAVING
FABRICATION STAGE CLOGGED
THROUGH-HOLES AND PROCESS OF
MAKING THE SAME

CROSS REFERENCE TO RELATED
APPLICATIONS

This application claims the priority benefit of Taiwan application Ser. No. 92107483, filed Apr. 2, 2003.

BACKGROUND OF INVENTION

A. Field of the Invention

This invention relates in general to a discrete circuit component and the process of its fabrication and, in particular, to one having temporarily-clogged through-holes in the fabrication stage and the process of its fabrication.

B. Description of the Related Art

Active and passive discrete circuit components such as diodes, resistors, capacitors and inductors etc. are widely used for the construction of electronic circuits. Regardless of either signal or power, or, linear or digital applications, different types of discrete circuit components are essential for the construction of various electronic circuit systems. Along with their counterparts fabricated inside integrated circuit (IC) devices, diodes, resistors, capacitors and inductors in the form of discrete circuit components are produced and consumed in mass quantities.

Due to the low unit prices and the large quantity used, fabrication of these discrete circuit components is particularly suitable for and, practically, requires automated mass production. Without production automation to achieve low price and fast production rates, these discrete products cannot be competitive commercially.

Circuit components of the discrete type are available in many different packages, among which the leaded package is one of the most common. With the constantly-pursued goal of miniaturization, discrete circuit components produced to the standard of SMT (Surface-Mount Technology) have become the indispensable components in modern electronics industry for the production of almost all sorts of electronic devices, regardless of whether or not they are of miniaturized design. However, as is well known in the art, the manufacture of many of these discrete circuit components still relies on human labor to certain extent. For example, some discrete diodes are manufactured with involvement of considerable level of human labor in some of its production procedural steps.

On the other hand, some conventional automated production methods for discrete circuit components employ the making of more than two through-holes for each component. Mechanical drilling of these through-holes for each of the component units in the gross matrix distributed over the entire fabrication substrate requires specific level of alignment precision. The drilling also requires that component die be sufficiently cleared off the vicinity of the through-holes structurally. Such spatial requirement places a limitation to the scale of possible reduction in overall component size. In other words, through-holes themselves take up spaces to prevent maximum possible packing density for the component. Further, through-holes formed during the intermediate stages of the device fabrication also incur other problems. For example, the application of molding material for hermetical sealing of the device die can be complicated due to the presence of the through-holes. Plastic molding material under molding pressure may undesirably leak through the through-holes to the opposite side of the structure.

Further, fixtures used for the fabrication of the discrete circuit components of different sizes are also different even though the structural configurations are the same. Different fixture sets has to be prepared for discrete components of the same construction but with different physical dimensions.

SUMMARY OF INVENTION

It is therefore an object of the present invention to provide a discrete circuit component having fabrication stage clogged through-holes and process of its fabrication suitable for the fabrication of miniaturized discrete circuit components at lost costs and high efficiency.

It is another object of the present invention to provide a discrete circuit component having fabrication stage clogged through-holes and the corresponding process of its fabrication suitable for the lost-cost and efficient fabrication of discrete circuit components of the same construction but vastly different sizes.

In order to achieve the above and other objects, the present invention provides a process for fabricating a discrete circuit component on a substrate, the first surface of said substrate having formed thereon a matrix of a plurality of dice surface trace sets each having a first and a second electrically conductive segments disconnected from each other, the second surface of said substrate having formed thereon a corresponding matrix of a plurality of soldering surface trace sets each having a first and a second electrically conductive segments disconnected from each other, and a plated through-hole electrically connecting each of said first and second conductive segments of each of said dice surface trace sets respectively to said first and second conductive segments of the corresponding soldering surface trace set; said process comprising the steps of: (a) clogging said plated through-holes; (b) placing a circuit die on said first conductive segment of each of said dice surface trace sets and electrically connecting the first electrode of said die thereto and electrically connecting the second electrode of said die to said second conductive segment of the same trace set; (c) hermetically sealing said dice and all dice surface trace sets on said first surface of said substrate; and (d) removing said clogging in said plated through-holes and physically separating each of said plurality of discrete circuit components by cutting into said hermetically sealed substrate for all individual ones of said dice.

The present invention also provides a discrete circuit component having a fabrication stage clogged through-hole comprising: a substrate, having formed on the first surface thereof a dice surface trace set having a first and a second electrically conductive segments, formed on the opposite second surface thereof a soldering surface trace set having a first and a second electrically conductive segments, and a plated through-hole connecting said first and second conductive segments of said dice surface trace set respectively to said first and second conductive segments of the corresponding soldering surface trace set; a circuit die fixedly placed on said first conductive segment of said dice surface trace set, the first electrode of said die being electrically connected thereto, and the second electrode of said die being electrically connected to said second conductive segment of the said trace set; and a hermetic seal sealing said die and said dice surface trace set on said first surface of said substrate.

BRIEF DESCRIPTION OF DRAWINGS

The above and other objects, features, and advantages of this invention will become apparent by way of the following detailed description of the preferred but non-limiting embodiments. The description is made with reference to the accompanying drawings.

DETAILED DESCRIPTION

Figure 1:
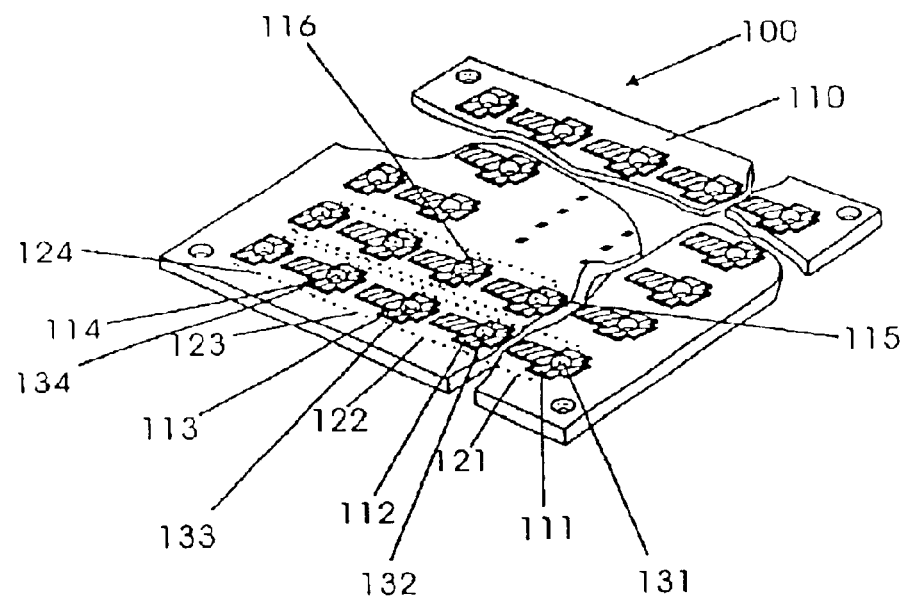
FIG. 1 is a perspective view of the dice surface of the substrate in accordance with a preferred embodiment of the present invention.

FIG. 1 is a perspective view of the dice surface of the substrate in accordance with a preferred embodiment of the present invention. As is illustrated, electrically conductive trace patterns 111 to 116 are formed over the dice surface 110 of the device substrate 100, which serves as the basic carrier plate for a large number of discrete circuit components fabricated in batch. Preferably, these initial-stage conductive trace patterns 111 to 116 are prepared in numbers of hundreds of them over the dice surface 110 and are aligned in, typically, a regular two-dimensional matrix. Note that the locations of the bodily structures for discrete circuit components are indicated by phantom-lined boundaries (121 to 124).

Figure 2:
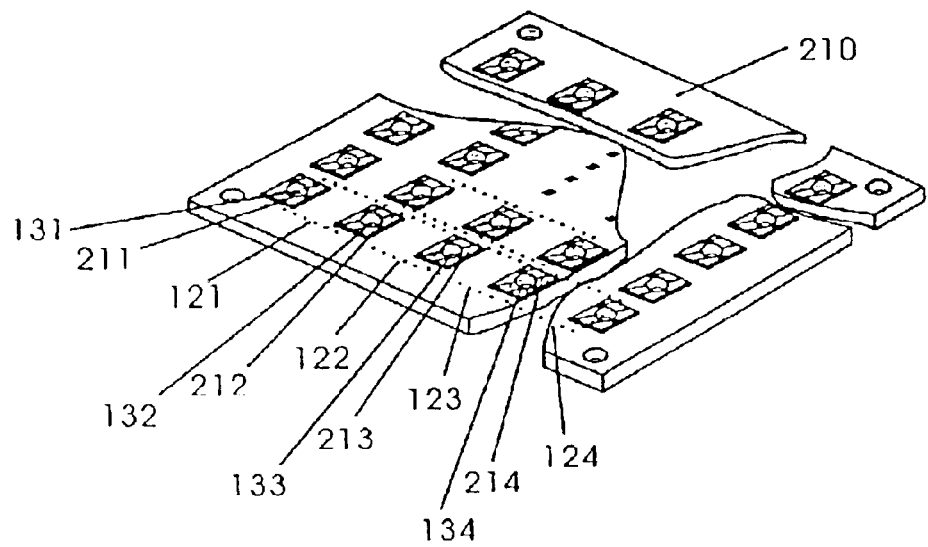
FIG. 2 is a perspective view of the soldering surface of the substrate of FIG. 1.

A counter matrix opposite to the matrix of the traces 111 to 116 on the dice surface 110 is also formed on the soldering surface of the substrate 100. Such a trace matrix comprises a large number of soldering surface conductive traces 211 to 214. FIG. 2 is a perspective view showing the soldering surface 210 of the substrate 100 of FIG. 1. Note that the soldering surface traces 211 to 214 are aligned in their matrix that is virtually a mirror-image of the dice surface matrix of the traces 111 to 116. For example, the trace 111 in dice surface matrix corresponds to trace 211 in the soldering surface matrix, trace 112 corresponds to trace 212, and so on. This conductive trace correspondence between the matrices on the dice and soldering surfaces of the substrate 100 can be easily observable if the perspective view or FIG. 2 is envisioned as the horizontal flipping over of the substrate 100 of FIG. 1.

At about the center of each of the soldering surface conductive traces as observed in FIG. 2, a plated through-hole (PTH) is formed. As the name implies, the PTH runs through the entire thickness of the substrate 100. Such PTHs are indicated as 131 to 134 in both FIGS. 1 and 2. For example, PTH 131 is formed for conductive trace 111 on the dice surface 110 and for conductive trace 211 on the soldering surface 210 of the substrate 100. A similar PTH 132 is formed for traces 112 and 212.

At about the center of each of the soldering surface conductive traces as observed in FIG. 2, a plated through-hole (PTH) is formed. As the name implies, the PTH runs through the entire thickness of the substrate 100. For example, as is illustrated in both FIG. 1 and 2, a PTH 131 is formed for conductive trace 111 on the dice surface 110 and for conductive trace 211 on the soldering surface 210 of the substrate 100. A similar PTH 132 is formed for traces 112 and 212.

Figure 3:
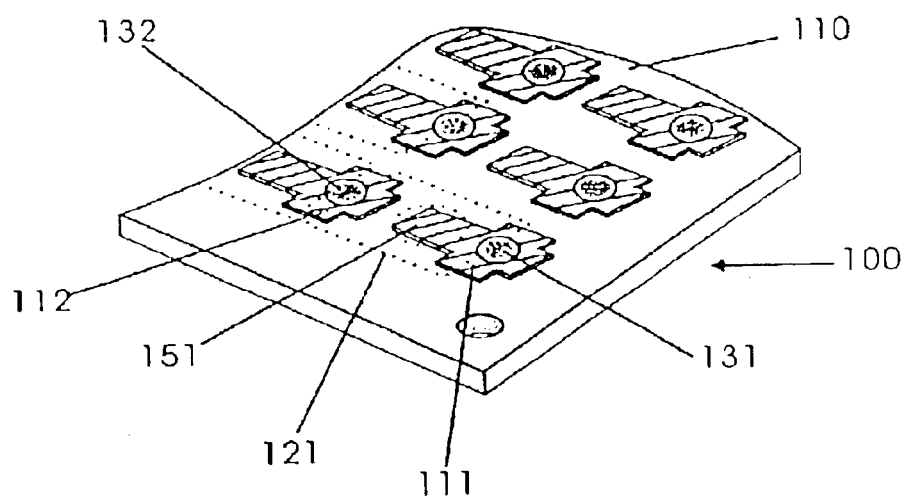
FIG. 3 illustrates a portion of the substrate of FIG. 1 showing the configuration details of the dice surface of the substrate.
Figure 4:
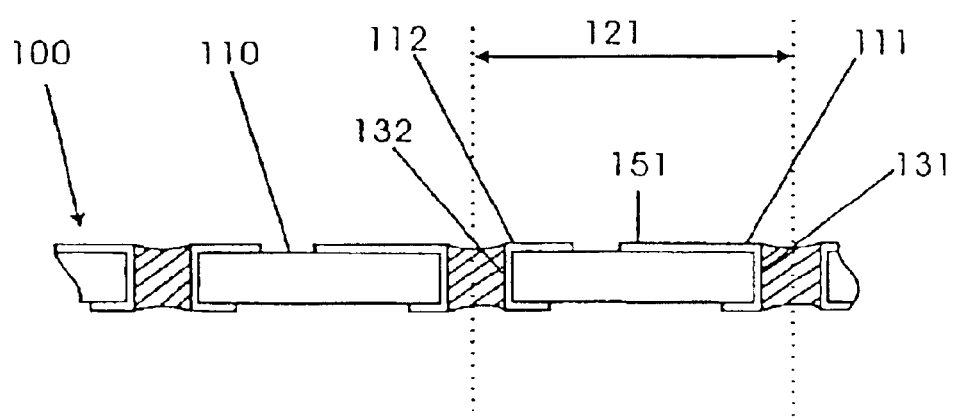
FIG. 4 is a cross-sectional view of the substrate illustrated in FIGS. 1 and 2.

FIGS. 3 and 4 together detail the relative spatial relationships between the PTH and its corresponding pair of conductive traces on the dice and soldering surfaces of the device substrate. FIG. 3 illustrates a portion of the substrate of FIG. 1, revealing the structural configuration details of the dice surface of the substrate, and FIG. 4 depicts the cross-sectional detail of the substrate 100. In all of the drawings, each generally rectangular area enclosed by a phantom-lined boundary, as will become even more obvious in the following descriptive paragraphs, represents a substantial physical area for the construction of one discrete component. For example, as is illustrated in FIG. 3, phantom-lined boundary 121 identifies the location of the bodily structure for one discrete circuit component to be constructed in accordance with the teachings of the present invention. Within and substantially at the center of this boundary 121, as is indicated by another phantom line 151, is the exact location where the circuit die is going to be placed for the construction of the very discrete circuit component. Location 151 is also the substantial center of the particular discrete circuit component to be constructed in area 121.

Note that as illustrated in the perspective view of FIG. 3, conductive traces formed on the dice surface 110 of the substrate 100 take the form of a generally asymmetric shape along the longitudinal direction (generally horizontal direction as viewed in the drawing) of the traces themselves. According to a preferred embodiment of the present invention, however, the traces (111 and 112 as observed in the drawing) are generally symmetric in shape within the area of the component footprint 121 along the direction orthogonal to their longitudinal axes.

The two consecutive dice surface traces 111 and 112, as is illustrated in FIG. 3, are electrically disconnected traces. In other words, all traces on the dice surface 110 of the substrate 100 are electrically independent traces. The same is also true for all soldering side traces. Each of the dice surface traces, 111 and 112 as detailed in FIG. 3 for example, can be considered to have a shape configuration that has an extra extension of linear conductive segment to the left than to the right of the central PTH. In a word, the dice surface traces has a longer right arm than left as observed in the perspective view of FIG. 3. This is also observable in the cross-sectional view of FIG. 4. In essence, in the case of the dice surface trace 111 in FIG. 3 for example, the right arm of the trace extends from its PTH 131 toward the component center, the die placement location 151 described above.

In the embodiment of the present invention depicted in FIG. 3, the right arm, or the left segment as observed in the drawing, of each dice surface trace is the segment extended. However, as is comprehensible to those skilled in the art, the alternate arrangement of having left arm extending is also applicable.

The cross-sectional view of FIG. 4 clearly shows all the through-holes are plated ones. As is illustrated, for example, surface of walls of the through-holes 131 and 132 can be plated with electrically conductive material such as metal via processes such as sputtering, electroplating, or other applicable means in the techniques employed for the making of, for example, printed circuit boards (PCBs). The plated metallic material or compounds/alloys thereof serves to provide a reliable and stable electrical conductive path between corresponding trace pairs on the dice and soldering surfaces 110 and 210 of the substrate 100.

The device substrate 100 as shown in the perspective views of FIGS. 1 and 2, as a whole, serves as the temporary base for the batch construction of a large number of discrete circuit components. As an electrically insulating carrier, the substrate 100 can, for example, be made of fiber-reinforced plastic (FRP) board, or be molded using a resin-based material. Dice and soldering surface traces can be formed, for example, from coating layers of copper foil using techniques such as photolithography.

Plated through-holes can be formed by first drilling the substrate in an NC procedure using adequate NC machines on their assigned locations on the substrate and then plating by sputtering or electroplating, as is detailed in the perspective view of FIG. 3. The result is the substrate 100 depicted in FIGS. 1 and 2.

After all the PTHs are formed in the device substrate, they are then clogged, or, filled in full, with a material. Within the scope of the present invention, the material used for such clogging into PTHs shown in FIGS. 1 and 2 can be any material with sufficient temperature resistance to melting. The material used to fill the PTHs should be one that is able to withstand the fabrication processing temperatures after its is filled into the PTHs and solidified at room temperature without failing its intended temporary clogging functionality. However, the clogging material used must also be able to be removed easily from all the PTHs after the batch fabrication of the discrete components are concluded. The clogging material must be removable, either before or after the physical separation of all the individual discrete components, via the use of, for example, water or organic solvent(s), or heating etc. so that the openness of all the PTHs can be regained.

Figure 5:
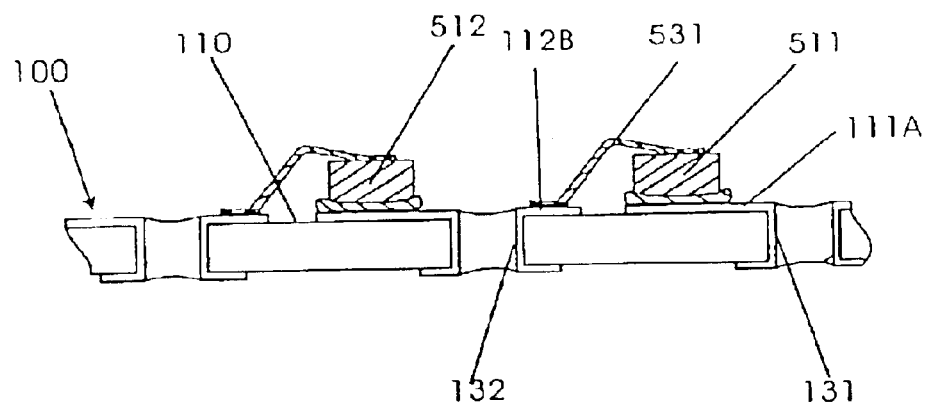
FIG. 5 is a cross-sectional view illustrating the placement of a device die of a discrete circuit component on the dice surface of the substrate and the formation of electrical contact therebetween.
Figure 6:
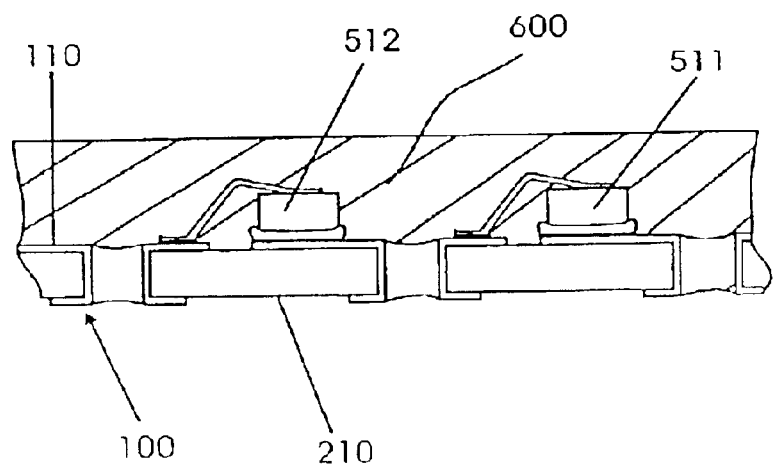
FIG. 6 is a cross-sectional view illustrating the hermetical sealing of the device die of FIG. 5 by a sealing material.

The device substrate 100 of FIGS. 3 and 4 are shown to have such clogging in place. The substrate 100 of FIG. 4 can be used for the placement of circuit dice for all discrete components batch fabricated. For each individual component, such as is shown in the cross-sectional view of FIG. 3, one circuit die will be placed onto the designated location 151 within its component area 121. For example, the cross-sectional view of FIG. 5 illustrates the placement of a device die 511 of a discrete circuit component on the dice surface 110 of the substrate 100 and also the formation of electrical contact between the die itself and its carrier. The placement of the circuit die 511 allows its bottom electrode to be electrically connected to the trace 111A as the die 511 is directly sitting on the trace 111A.

The permanent connection between the circuit die 511 and the trace 111A can, for example, be made by a heating procedure so that solder material such as a tin-based solder pre-formed on the surface of the electrode of the die can be soldered onto the corresponding designated location (151 shown in FIG. 4) over the surface of the trace 111A.

Electrical connection between the other, i.e., top, electrode of the die 511 and the other of the traces, 112B, can then be made after the die 511 is firmly secured in place by its electrical connection with trace 111A. In the depicted embodiment of FIG. 5, a jump wire 531, for example, can be used to implement this electrical connection between the top electrode of the die 511 and the trace 112B.

Figure 7:
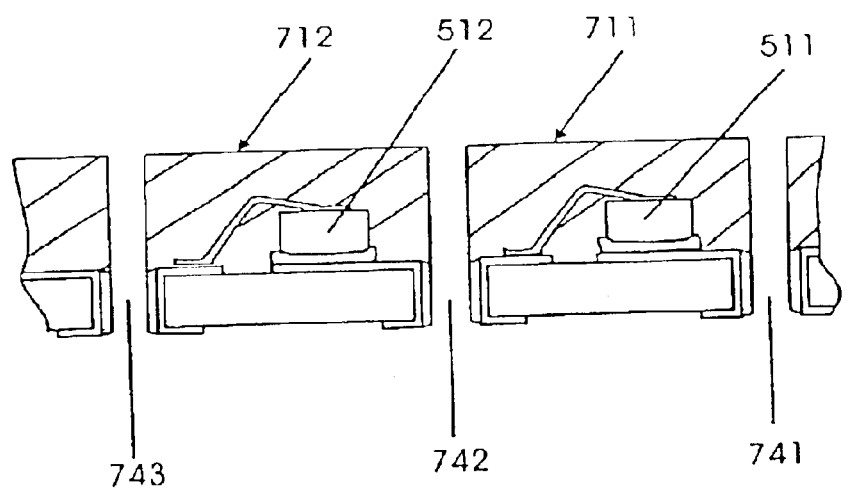
FIG. 7 is a cross-sectional view illustrating the physical separation of the discrete circuit components from the gross substrate.

Afterwards, as is shown in the cross-sectional view of FIG. 7, each individual discrete component can now be physically separated from the mass matrix. Note that the separation between two consecutive components 711 and 712 along the device longitudinal axis can be made by cutting pass through the center of the PTH, as illustrated by cut paths 741, 742 and 743. To cut loose the component 711 in FIG. 7, two cut paths 741 and 742 passing through centers of the two PTHs must be followed. Further, as is comprehensible, at least two other cuts orthogonal to the cuts 741 and 742 are also required in order to release the component 711 from the mass matrix.

Figure 8:
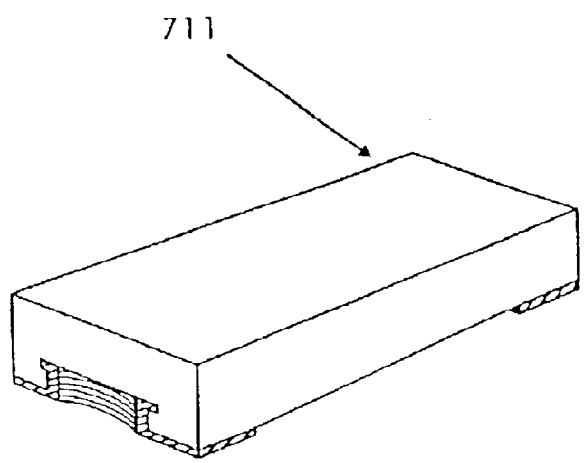
FIGS. 8 and 9 are respectively perspective views showing the structural details of the discrete circuit component of the present invention.
Figure 9:
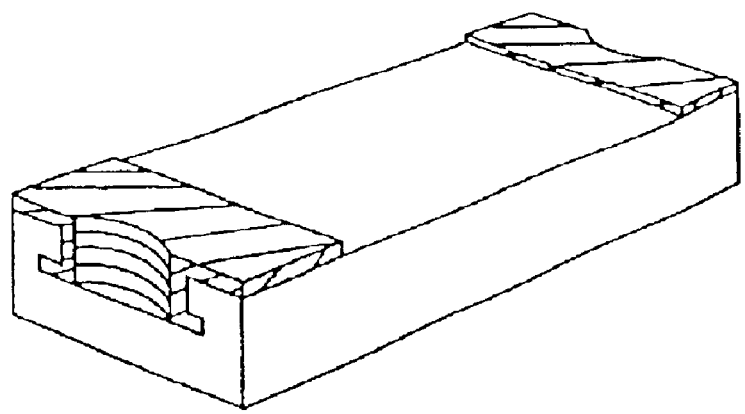

FIGS. 8 and 9 are respectively perspective views showing the structural details of the discrete circuit component of the present invention. Due to the fact that the cutting for physical separation of a discrete component is through the center of the PTHs, relatively large revealed surfaces 131 and 132 are present at both opposite ends along the longitudinal direction of the component 711. Electrically conductive surfaces 131 and 132 are curved in nature as they are themselves portions of their corresponding PTH. They substantially rise vertically from the soldering surface suggested by the soldering surfaces of the component as designated in FIGS. 8 and 9. After the removal of the temporary clogging material, the concave spaces partially enclosed by the surfaces 131 and 132 become effective spaces for extracting molten solder as the component 711 is undergoing SMT operation in its use in an electronic equipment. Such solder extraction assists in the automatic correcting alignment of the component itself at its assigned location on the PCB of the equipment.

FIGS. 8 and 9 are respectively perspective views showing the structural details of the discrete circuit component of the present invention. Due to the fact that the cutting for physical separation of a discrete component is through the center of the PTHs, relatively large revealed surfaces 131 and 132 are present at both opposite ends along the longitudinal direction of the component 711. Electrically conductive surfaces 131 and 132 are curved in nature as they are themselves portions of their corresponding PTH. They substantially rise vertically from the soldering surface suggested by the soldering surfaces of the component as designated in FIGS. 8 and 9 by reference numerals 751 and 752. After the removal of the temporary clogging material, the concave spaces partially enclosed by the surfaces 131 and 132 become effective spaces for extracting molten solder as the component 711 is undergoing SMT operation in its use in an electronic equipment. Such solder extraction assists in the automatic correcting alignment of the component itself at its assigned location on the PCB of the equipment.

Within the scope of the discrete circuit component of the present invention, although PTHs are formed and play the important role for the functionality of the component, they have, however, been clogged at the early stage of the fabrication of the inventive component. They become substantially inexistent for the subsequent component fabrication procedural steps. In other words, the entire space above the device substrate for the batch fabrication of the discrete circuit components can be fully utilized for the requirement of the component miniaturization. This allows the inventive discrete circuit component to be particularly suitable for miniaturized discrete circuit components, especially small devices of the 0603 and 0402 dimensions, and even smaller ones not yet defined in the industry.

Also, since the PTHs have been clogged at the early stage of the component fabrication, and the clogging are not removed until before or even after the individual components are physically separated from each other, there is at least another major advantage for the discrete circuit component of the present invention. Since the entire device substrate is in effect one plate without holes, it can be treated as one single large plate for standardized processing even for the fabrication of components of different physical sizes of the same construction. This allows for the unification of the necessary fixture and tools for different-sized components. Such unification results directly into reduced costs and increased efficiency for the fabrication of an entire line of circuit components of different physical sizes but of the same construction.

While the above is a full description of a specific embodiment of the present invention, various modifications, alternative constructions and equivalents may be used. Also, although only the general and broad term of "discrete circuit components" has been used in the above descriptive paragraphs in the description of the preferred embodiment of the present invention, it is comprehensible for those skilled in the art that any discrete component of the SMT type complying to the EIA standard are certainly applicable to the invention. These include, but are not limited to, discrete components such as Zener and Schottky diodes, discrete capacitors of either polarity or non-polarity nature, discrete resistors, even certain active components such as transistors, with more than two electrical leads. More, the invention is not only applicable to those common 1210, 1206 and 0805 dimensions of the EIA standard components, those with even smaller dimensions that are not listed in EIA are also applicable. In fact, the invention is particularly suitable for miniaturized SMT devices. Further, the dice and soldering surface traces can be formed of solidified silver-containing paste, copper-containing paste, or pastes of alloys of such metals. The traces can further be coated with nickel, gold and/or other metal. Therefore, the above description and illustrations should not be taken as limiting the scope of the present invention which is defined by the appended claims.

What is claimed is:

1. A discrete circuit component having a fabrication stage clogged through-hole comprising:

a substrate, having formed on a first surface thereof a dice surface trace set having a first and a second electrically conductive segments, formed on an opposite second surface thereof a soldering surface trace set having a first and a second electrically conductive segments, and one plated through-hole for connecting each of said first and second conductive segments of said dice surface trace set respectively to said first and second conductive segments of said soldering surface trace set;

a circuit die having a first and a second electrode, the first electrode of said die being electrically connected to said first conductive segment of said dice surface trace set, and the second electrode of said die being electrically connected to said second conductive segment of said dice surface trace set; and a hermetic seal sealing said die and said dice surface trace set on said first surface of said substrate.

2. The discrete circuit component of claim 1, wherein said traces formed on said dice surface of said substrate are solidified silver paste.

3. The discrete circuit component of claim 1, wherein said traces formed on said dice surface of said substrate are solidified copper paste.

4. The discrete circuit component of claim 1, wherein said traces formed on said dice surface of said substrate are solidified copper alloy paste.

5. The discrete circuit component of claim 1, wherein said traces formed on said soldering surface of said substrate are coated by nickel.

6. The discrete circuit component of claim 1, wherein said traces formed on said soldering surface of said substrate are coated by gold.

7. The discrete circuit component of claim 1, wherein said circuit die is a diode die.

8. The discrete circuit component of claim 1, wherein said circuit die is a transistor die.

9. The discrete circuit component of claim 1, wherein said circuit die is a capacitor die.

10. The discrete circuit component of claim 1, wherein said circuit die is a resistor die.

11. A discrete circuit component having a fabrication stage clogged through-hole comprising:

a substrate, having formed on a first surface thereof a dice surface trace set having at least a first and a second electrically conductive segments, formed on an opposite second surface thereof a soldering surface trace set having at least a first and a second electrically conductive segments, and one plated through-hole for connecting each of said first, second and more conductive segments of said dice surface trace set respectively to said first, second and more conductive segments of said soldering surface trace set;

a circuit die correspondingly having at least a first and a second electrode, the first electrode of said die being electrically connected to said first conductive segment of said dice surface trace set, and the second and more electrodes of said die being electrically connected respectively to said second and more conductive segments of said dice surface trace set; and a hermetic seal sealing said die and said dice surface trace set on said first surface of said substrate.

* * * * *